United States Patent [19]

Rosenstrach et al.

[11] Patent Number: 5,119,425
[45] Date of Patent: Jun. 2, 1992

[54] SOUND SYNTHESIZER

[75] Inventors: Paul A. Rosenstrach, Newport; Michael A. Deaett, N. Kingstown, both of R.I.

[73] Assignee: Raytheon Company, Lexington, Mass.

[21] Appl. No.: 780,836

[22] Filed: Oct. 23, 1991

Related U.S. Application Data

[63] Continuation of Ser. No. 459,420, Jan. 2, 1990, abandoned.

[51] Int. Cl.⁵ .............................................. G10L 5/00
[52] U.S. Cl. ..................................................... 381/51
[58] Field of Search .................................... 381/36–40, 381/51-53

[56] References Cited

U.S. PATENT DOCUMENTS

| | | |
|---|---|---|
| 4,327,419 | 4/1982 | Deutsch et al. . |
| 4,400,788 | 8/1983 | Myers et al. . |
| 4,587,620 | 5/1986 | Niimi et al. . |
| 4,587,670 | 5/1986 | Levinson et al. ............... 381/43 |
| 4,593,367 | 6/1986 | Slack et al. . |
| 4,599,692 | 7/1986 | Tan et al. . |
| 4,599,693 | 7/1986 | Denenberg . |
| 4,620,286 | 10/1986 | Smith et al. . |
| 4,677,628 | 6/1987 | Laviron . |
| 4,718,087 | 1/1988 | Papamichalis ............... 381/34 |
| 4,783,804 | 11/1988 | Juang et al. . |

Primary Examiner—Emanuel S. Kemeny
Attorney, Agent, or Firm—Denis G. Maloney; Richard M. Sharkansky

[57] ABSTRACT

A pseudo-random or transient synthesized signal is provided by analysis of a plurality of related signals by vector quantization of linear predictive coding coefficients (cluster representatives) of time blocks of the signals and providing cumulative probability matrices for the transition from one cluster representative for one block to a cluster representative of the next successive block of each of the signals. Synthesis of the pseudo-random signal is provided by randomly selecting according to a cumulative transition probability, the cluster representative of a next successive block given the selected cluster representative of the previous block, the coefficient of each block time being applied to a noise-excited recursive filter to generate the pseudo-random synthesized signal. Synthesis includes probabalistic models using Markov transitions, to produce transient sounds such as sonar, hatch closings, and hull groans.

8 Claims, 9 Drawing Sheets

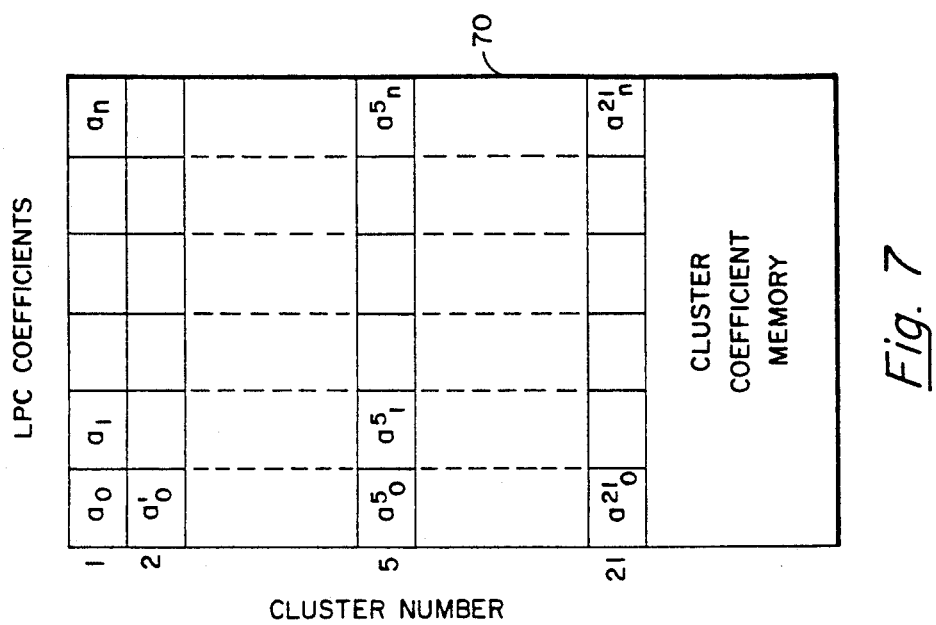
Fig. 7
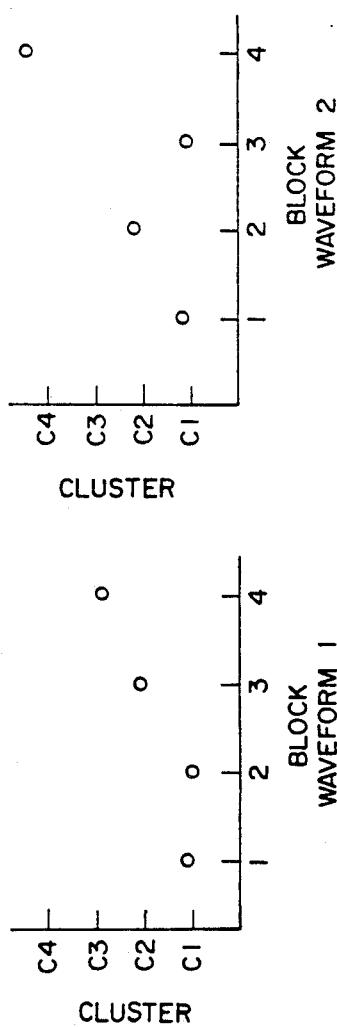
Fig. 2A
Fig. 2B
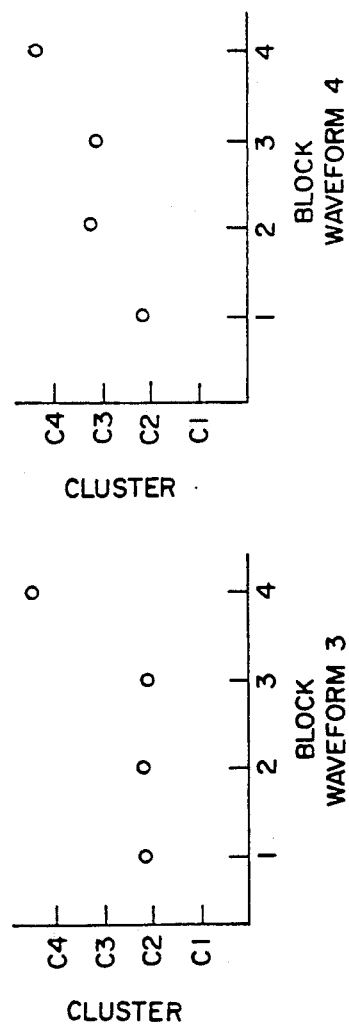
Fig. 2C
Fig. 2D

```
            TO:
       C1   C2   C3   C4
CLUSTER
OCCUPIED [ 0.5  0.5   0    0 ]
(NONE)
       START TO BLOCK 1
```

*Fig. 3A*

```
                      TO:
                 C1    C2    C3    C4
              ┌                          ┐
          C1  │ 0.5   0.5    0     0     │
              │                          │
FROM CLUSTER
          C2  │  0    0.5   0.5    0     │
              │                          │
          C3  │  0     0     0     0     │
              │                          │
          C4  │  0     0     0     0     │
              └                          ┘
                 BLOCK 1 TO BLOCK 2
```

*Fig. 3B*

```
                      TO:
                 C1    C2    C3    C4
              ┌                          ┐
          C1  │  0     1     0     0     │
              │                          │
FROM CLUSTER
          C2  │ 0.5   0.5    0     0     │
              │                          │
          C3  │  0     0     1     0     │
              │                          │
          C4  │  0     0     0     0     │
              └                          ┘
                 BLOCK 2 TO BLOCK 3
```

*Fig. 3C*

```
                      TO:
                 C1    C2    C3    C4
              ┌                          ┐
          C1  │  0     0     0     1     │
              │                          │
FROM CLUSTER
          C2  │  0     0    0.5   0.5    │
              │                          │
          C3  │  0     0     0     1     │
              │                          │
          C4  │  0     0     0     0     │
              └                          ┘
                 BLOCK 3 TO BLOCK 4
```

*Fig. 3D*

$$\text{START} \begin{bmatrix} \text{C1} & \text{C2} & \text{C3} & \text{C4} \\ 0.5 & 1 & 0 & 0 \end{bmatrix}$$

START TO BLOCK 1

Fig. 4A

TO CLUSTER:

$$\begin{array}{c} \\ \text{FROM CLUSTER} \end{array} \begin{array}{c} \text{C1} \\ \text{C2} \\ \text{C3} \\ \text{C4} \end{array} \begin{bmatrix} \text{C1} & \text{C2} & \text{C3} & \text{C4} \\ 0.5 & 1.0 & 0 & 0 \\ 0 & 0.5 & 1 & 0 \\ 0 & 0 & 0 & 0 \\ 0 & 0 & 0 & 0 \end{bmatrix}$$

BLOCK 1 TO BLOCK 2

$$\begin{array}{c} \\ \text{FROM CLUSTER} \end{array} \begin{array}{c} \text{C1} \\ \text{C2} \\ \text{C3} \\ \text{C4} \end{array} \begin{bmatrix} \text{C1} & \text{C2} & \text{C3} & \text{C4} \\ 0 & 1 & 0 & 0 \\ 0.5 & 1 & 0 & 0 \\ 0 & 0 & 1 & 0 \\ 0 & 0 & 0 & 0 \end{bmatrix}$$

BLOCK 2 TO BLOCK 3

$$\begin{array}{c} \\ \text{FROM CLUSTER} \end{array} \begin{array}{c} \text{C1} \\ \text{C2} \\ \text{C3} \\ \text{C4} \end{array} \begin{bmatrix} \text{C1} & \text{C2} & \text{C3} & \text{C4} \\ 0 & 0 & 0 & 1 \\ 0 & 0 & 0.5 & 1 \\ 0 & 0 & 0 & 1 \\ 0 & 0 & 0 & 0 \end{bmatrix}$$

BLOCK 3 TO BLOCK 4

$$\begin{array}{c} \\ \text{FROM CLUSTER} \end{array} \begin{array}{c} \text{C1} \\ \text{C2} \\ \text{C3} \\ \text{C4} \end{array} \begin{bmatrix} \text{C1} & \text{C2} & \text{C3} & \text{C4} \\ 0 & 0 & 0 & 0 \\ .25 & .25 & .25 & .25 \\ 0 & 0 & 0 & 0 \\ 0 & 0 & 0 & 0 \end{bmatrix}$$

BLOCK TO BLOCK

$$\begin{array}{c} \\ \text{FROM CLUSTER} \end{array} \begin{array}{c} \text{C1} \\ \text{C2} \\ \text{C3} \\ \text{C4} \end{array} \begin{bmatrix} \text{C1} & \text{C2} & \text{C3} & \text{C4} \\ 0 & 0 & 0 & 0 \\ .25 & .5 & .75 & 1 \\ 0 & 0 & 0 & 0 \\ 0 & 0 & 0 & 0 \end{bmatrix}$$

BLOCK TO BLOCK

Fig. 5B

SOUND SYNTHESIZER

This application is a continuation of application Ser. No. 459,420 filed Jan. 2, 1990, now abandoned.

BACKGROUND OF THE INVENTION

This invention relates to the synthesis of signals from stored data which are sets of the coefficients of a recursive filter where each set is applied to the filter for a fixed time period, the periods totaling the duration of the synthesized signal. More particularly, the sets of coefficients include the probabilistic modeling of non-repetitive ensembles of transient sounds by means of Markov transitions over sets of vector quantized linear predictive coding (LPC) modeling coefficients.

In patent application U.S. Ser. No. 332,414, now U.S. Pat. No. 5,005,204, issued Apr. 2, 1991, assigned to the same assignee as this application, which is incorporated herein by reference, a single analog sound transient was divided into time-blocks of equal length and for each block a set of coefficients for a linear predictive coding (LPC) circuit was obtained. The circuit provided a satisfactory replica of the signal from which the LPC modeling coefficients were obtained with a small variation in the sound of successive synthesized signals because of the randomness produced by the random noise source applied to the input of the linear predictive filter.

The modeling of non-stationary acoustic signatures, termed transients, is of critical importance in the design of detection processors and in the accurate production of synthetic signatures for sonar trainers, and test target generators. Sonar training, which involves the recognition of a contact's existence and maneuvering condition, requires an accurate interpretation of transient contact emissions which in turn must be faithfully generated by a contact synthesizer. Currently such sounds are provided by magnetic tape players which are cumbersome to use, are not synchronized with the evolving scenario, and produce distorted results due to recorded background noise. Transient detection processing which provides the means for identifying the otherwise quiet contacts, requires a transient signature model which not only is of high-fidelity, but, in addition, provides the basis for detection methods which are processing efficient.

Classified as transients are those signatures of possibly several hours duration which exhibit a rapid, yet statistically regular, pattern of spectral energy fluctuation. Examples of the sounds to be modeled include hatch closings, shrimp snaps, ice crackling, hull groans, shifting cargo, and steering actuator emissions.

As a result of LPC analysis/synthesis, a reasonable replication of the original sound is attained. The required synthesis is accomplished by a recursive filter as shown in FIG. 2 of the referenced application. The arithmetic burden required for the implementation of the synthesis is significant. Each output sample requires $(N+1)$ multiply-accumulations where N is the number of filter coefficients. If the output data rate is $F_S$ samples per second, then $(N+1)F_S$ multiply-accumulations per second are required. An even more significant factor from an implementation viewpoint is the total number of modeling filter coefficients required for synthesizing a signature. These coefficients must be stored in a limited size synthesizer memory and therefore constitute a significant implementation burden. Every block of 8 millisecond duration, for instance, requires approximately ten coefficients and one gain value. The resulting number of bits of coefficient memory for LPC synthesis is thus, $N_c=(16)(125)(11)T_s=22000\ T_s$ bits of memory, where 16-bit words are used, 125 blocks per second are processed, 11 words per block are required, and $T_s$ is the total duration of signature synthesis in seconds. For direct synthesis from stored sample at an assumed 16 kHz sample rate, the required number of bits is $N_d=(16)(1.6\times 10^4)T_s=256,000\ T_s$ bits so that a 10:1 data compression is accomplished. However, it can be seen that one megabit of RAM memory will support only 45 seconds of LPC synthesized sound. The synthesis requirement exists for non-stationary sounds which last for several hours, so, clearly, additional data compression is desirable.

SUMMARY OF THE INVENTION

It is therefore an objective of the modeling procedure of this invention to abstract the distinguishing sound characteristics and to parameterize them via a probabilistic model.

It is an object of this invention to provide a method of synthesizing, pseudo-random signatures which are non-repetitive in nature. Prior art synthesizers produce generated signatures which are virtually identical upon each generation instance. This repetition is not realistic. Therefore, capturing the essential patterns of variations which exist within a class of sounds is important and is provided by this invention.

While direct LPC techniques lead to acceptable signatures, the coefficient sets utilized result in a large data base which is not easily amenable to further modeling abstraction. Therefore, a further step in data reduction is required in order to reduce this data base to a small set of modeling coefficients into which all of the modeling coefficients sets can be mapped. The mapping introduces a further, although insignificant, distortion in the synthesized signal which is evaluated by means of the likelihood ratio distortion measure. The mapping process employed is single-pass vector quantization by which acceptable synthesized signatures can be produced by using a limited number of representative coefficient sets called "cluster" coefficient sets. A time series of cluster assignments, which is termed "a cluster observation sequence", results, which represents the mapping of each block's LPC coefficients into a cluster representative.

The method of synthesis of the prior U.S. application referred to above has been extended to include probabilistic models by means of Markov transitions derived from the non-repetitive ensemble of cluster observation sequences produced by a transient sound. The sound which is so characterized is considered to exhibit the two characteristic excitation states, background generation and transient generation. In each characteristic state, the sequential evolution of the cluster observation sequence is viewed as a Markov chain which is governed by a time varying Markov transition matrix. Two different classes of sound signatures, periodic and Poisson-excited, are modeled. In the case of periodic processes, such as cavitation, the transient state is continually exhibited and a periodic sequence of transition matricies repetitively characterizes the sound. In the case of long term transients, the transient generation state is entered according to a Poisson event process. Between transient states, the background state which is characterized by a distinct transition matrix is entered. The resulting set of cluster representative modeling filter coefficients together with the Markov transition matrices are employed in this invention to provide an efficient method of long term transient signature synthesis.

BRIEF DESCRIPTION OF THE DRAWINGS

The foregoing features of this invention, as well as the invention itself, may be more fully understood from the following detailed description of the drawings, in which:

FIG. 2 shows graphically the distribution of clustered coefficients for four of the waveforms of FIG. 1.

FIG. 3 shows the probability of a transition from one cluster in one block to one of the possible clusters of the next successive block.

FIG. 4 shows the cumulative probability of a transition from one cluster of one block to one of the possible clusters in the next successive block.

FIGS. 5A and 5B show a cluster transition probabilities and cumulative transition probabilities, respectively, for a different probability distribution than assumed for FIGS. 3A–3D and 4A–4D, respectively.

FIG. 7 illustrates clustered coefficients in a coefficient memory.

DESCRIPTION OF THE PREFERRED EMBODIMENT

Figure 1:
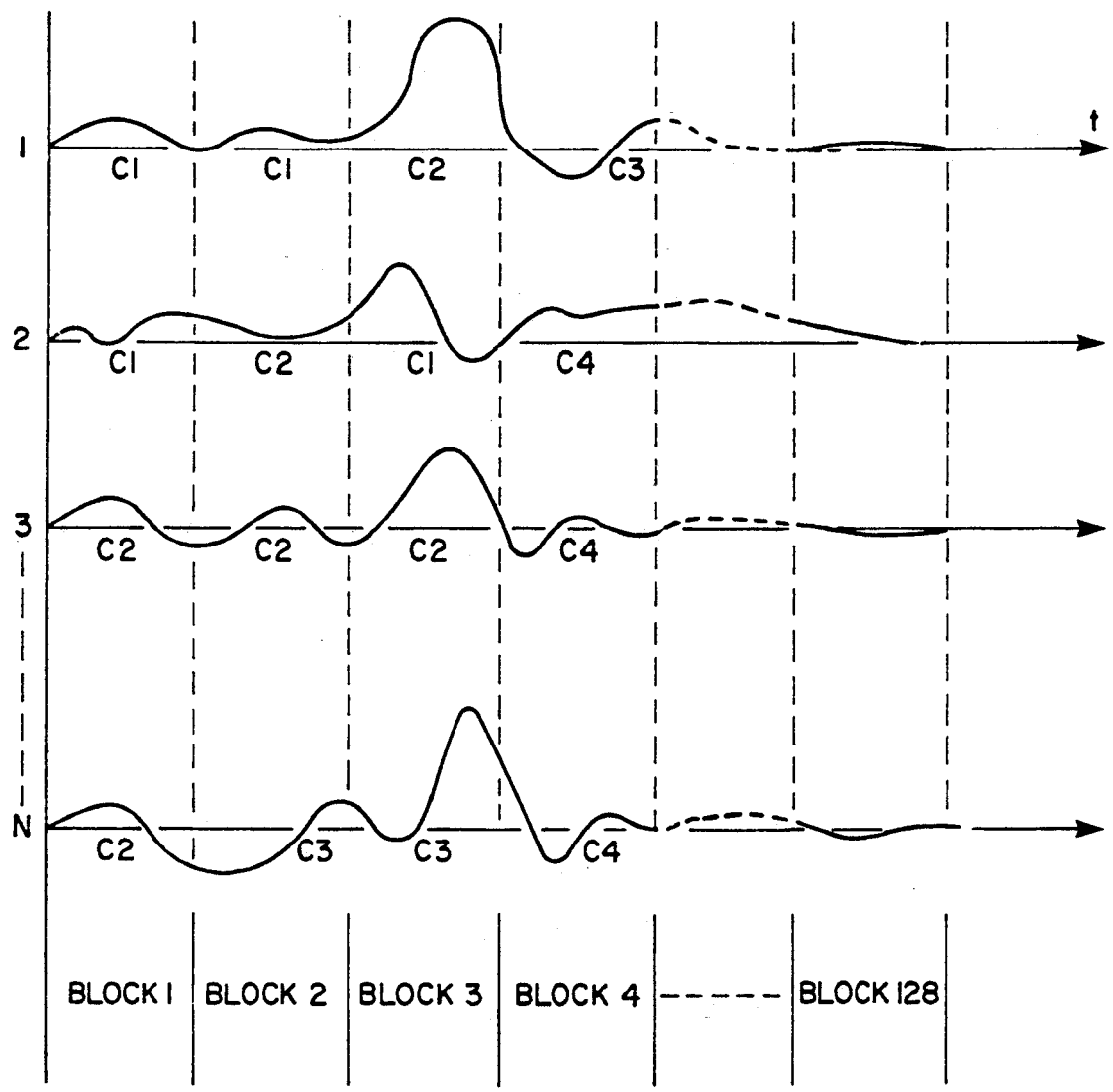
FIG. 1 is a graphical representation of transient signals used before analysis in obtaining the probability-weighted clustered linear prediction coefficients of a recursive filter.

A step toward achieving this goal of additional data compression can be taken by using vector quantization. In vector quantization, it is recognized that if the LPC coefficient sets are modified slightly, that some additional distortion will result but that if the modification is small, then the resulting distortion will be minor. The measure of distortion which is utilized in this invention is related to subjective perception and is the likelihood ratio distortion measure. This measure is calculated by taking the ratio of the additional modeling error incurred by the use of a non-optimal modeling filter to that minimum error incurred by the use of the optimum filter. For any LPC coefficient set, this residual modeling error is calculated as $$E_p = r_a(0)r_x(0) + 2 \sum_{k=1}^{p} r_a(k)r_x(k),$$

where $r_a(k)$ is the autocorrelation of the filter coefficients $a(k)$ which can be expressed in its unnormalized form as $$r_a(k) = \sum_{n=0}^{p-k} a(n)a(n+k),$$

where p is the number of modelling filter coefficients. Also, $r_x(k)$ is the data autocorrelation function;

$$r_x(k) = \sum_{n=0}^{N-k} x(n)x(n+k).$$

where N is the number of samples in a block of the signal being analyzed. For the optimal set of coefficients determined, for example, by Levinson recursion, the residual modeling error is $E_p$. $\overline{E}_p$ is the residual error from the optimal set of coefficients. The likelihood ratio distortion measure is then calculated as $D(A,\overline{A}) = (E_p - \overline{E}_p)/\overline{E}_p$. $\overline{A}$ is the optimal set of coefficients for the block, and A is one of the sets of coefficients (clusters) selected for each previous block. Typical values for $D(A,\overline{A})$ are in the range of 0.5–2, values which produce synthesized signals in which the distortion is sufficiently low that the synthesized sound is a useful replica of the original sound from which the data was obtained for the synthesis procedure.

In LPC block-based analysis, many sets of coefficients are generated. By selecting a subset of these sets to represent all the blocks of data, then at the cost of some additional distortion, a reduced number of coefficients may be stored for synthesis. A smaller number of representative coefficient sets must be examined during the abstraction process by which a stochastic signature model is achieved. In this invention, therefore, a clustering process is used which assigns each signature data block to a cluster representative such that the distortion is less than a predetermined threshold. If the representation of a data block by the LPC coefficients of any of the previously determined cluster representatives cannot produce a distortion less than the threshold, then a new cluster based on the data block being examined is established. If the threshold is not exceeded, then the cluster representative producing the least representation distortion is utilized. The result of this vector quantization process is a set of clusters, that is, groups of data blocks assigned for analysis representation to a cluster representative $C_i$, $C_i \rightarrow \{a_1^i, \ldots, a_p^i\}$ where $a_k^i$ is the kth coefficient of the ith cluster representation set. As an example of the data compression available through vector quantization, a cavitation signature was acceptably vector quantized using 18 coefficient sets to represent 512 blocks of data. This is a compression ratio of nearly 30:1 over that of straightforward LPC analysis. Also, the ratio is limited by the length of the signature record being analyzed since the number of clusters required does not grow linearly with record length. These 18 cluster representatives form the set upon which further modeling abstraction by Markov processes can be accomplished. Specifically, the mapping of the data blocks into clusters can be displayed in a cluster observation sequence. The objective of Markov signature analysis is to produce a probabilistic model which accurately describes the time evolution of the signature process across cluster assignments.

Referring to FIG. 1, there are shown waveforms 1, 2, 3, ..., N for transient sound signals, such as that produced by the closing of a hatch cover, each signal waveform being produced for each closing. As another example, each waveform could be one period of the cavitation noise produced by a rotating propeller. The gross features of each of the waveforms are oriented along the time axis so that they roughly correspond in time. For example, for the case of signal waveforms produced by the closing of a hatch cover, the initiation of the sound waveform for each of the succession of hatch closings should correspond to the same time, $t=0$. For the case of a cavitation signal produced by a rotating propeller, the beginning of a waveform period may not be so easily determined. However, the waveforms may be LPC analyzed to establish period starts by choosing as the start of the period that starting point which results in the minimum number of total cluster sets in accordance with this invention by a succession of LPC analyses using different cycle start times. Although the waveform of the analog signals produced by each closing of the hatch cover or propeller period will in general be different, the total number of different sets of coefficients (clusters) which are obtained from LPC analysis of all the waveforms will be reduced in accordance with the method of this invention.

The waveforms shown in FIG. 1 are assumed to be reasonably close to the beginning of a period at the corresponding times. An LPC analysis on each waveform as described in the U.S. patent application Ser. No. 332,414 is performed on blocks 1–128, where if it is assumed that each block is 8 milliseconds in time duration, that the total time duration of the waveform to be analyzed is one second, and that the number N of waveforms is ten, 1280 sets of coefficients will be required. Where the waveforms being analyzed are of longer duration such as, for example, one minute in length, the number of sets of coefficients will be significantly larger (sixty times in this example) and substantial memory must be utilized in order to digitally store each coefficient of each of the sets as in the referenced application.

To reduce the number of sets of coefficients, the sets are vector quantized so that the preceding illustration of 1280 sets of LPC coefficients for the ten waveforms are represented by a lesser number of sets (or clusters) of coefficients. The sets of coefficients which fall into one cluster are determined by the allowable limit on distortion where the threshold value is evaluated by the likelihood ratio distortion measure, as determined by the equation given earlier. Thus, by way of illustration and depending upon the level of distortion which is acceptable, the 1280 sets of coefficients may be substantially reduced.

However, the generated signatures using vector quantization alone will be repetitive, whereas multiple samples of a real signature will exhibit random variations.

Each of the waveforms 1, 2, . . . , N of FIG. 1 are shown divided into eight millisecond blocks labeled 1, 2, 3, . . . , 128. Each block of each waveform when subjected to the LPC analysis produces a set of coefficients which after vector quantizing provides clusters of LPC coefficients less in number than the possible 128 sets of coefficients for each waveform 1, - - - ,N. For waveform 1, it is assumed that the sets of coefficients for blocks 1 and 2 can be clustered into one set of coefficients C1, where C1 are the coefficients calculated for block 1, the calculations of coefficients being performed by the LPC analysis. It is assumed that the set of LPC coefficients obtained for block 2 of waveform 1 when compared to the set of coefficients C1 result in the error being less than a prescribed amount, and hence the coefficients of cluster C1 are substituted for the coefficients calculated for block 2. The calculated LPC coefficients for block 3 of waveform 1 are assumed to fall outside the prescribed allowable error when cluster C1 is used. Hence the calculated LPC coefficients for block 3 are designated as cluster C2. This process is continued for all the blocks of all the waveforms 1, 2, 3, . . . , N whose calculated LPC coefficients are evaluated relative to all previous cluster LPC coefficients (in this example C1, C2) to determine whether additional cluster LPC coefficients need be established. The first four blocks of all the waveforms are assumed to have the cluster values C1, - - - , C4. FIGS. 2A-2D show the distribution of clusters C1-C4 for each block 1-4 for each waveform 1-3, and N, respectively. By way of example, FIGS. 2A-2D show that block 1 of all the waveforms have calculated LPC coefficients which may be replaced by the coefficients in clusters C1 or C2, whereas block 2 has calculated LPC coefficients which may be replaced by the coefficients of clusters 1, 2, or 3.

Figure 11:
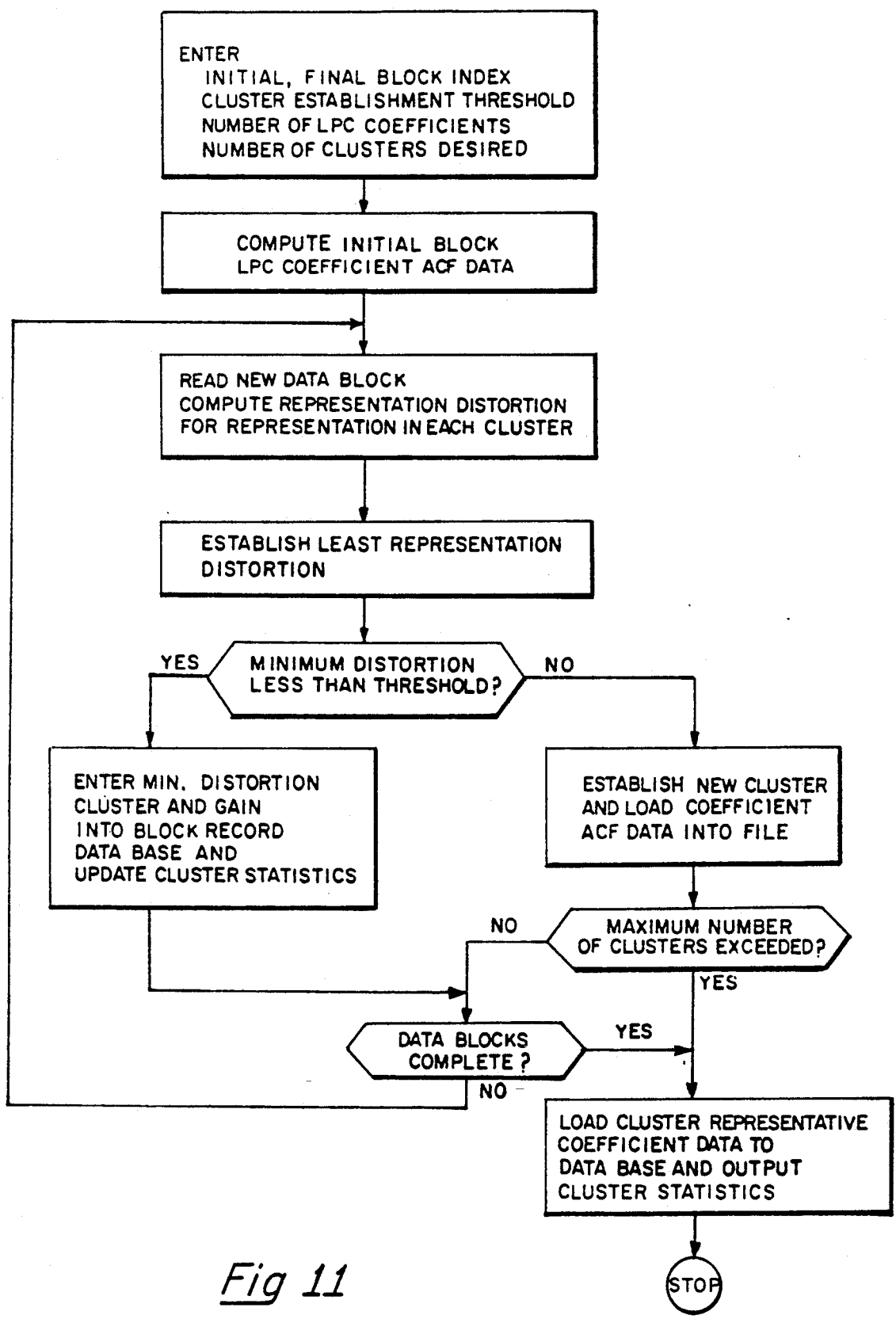
FIG. 11 is a flow diagram showing the steps for obtaining the clustered coefficients utilized in this invention.

The algorithm which has been used in the preferred embodiment of this invention is a clustering algorithm, which differs from those of the prior art and is shown in the flow diagram of FIG. 11. The program requires, as an input the index of the initial block to be used to start the distortion analysis as well as the cluster formation distortion threshold, the number of blocks to be analyzed, the block duration, and the number of LPC coefficients. With these inputs the analysis can be limited to any contiguous sequence of blocks in the data. The algorithm begins by storing the first block LPC coefficient autocorrelation function (ACF) data in memory. The next block of sampled data is retrieved from memory and the LPC coefficient ACF for this block is calculated, as well as the ACF of the sample data. Using this information, the representation distortion incurred by using the first set of LPC coefficients instead of the optimal set derived by Levinson recursion is calculated. If this distortion exceeds the cluster establishment threshold, then a new cluster is established, which is represented by the LPC coefficients of the new data block. In addition, the LPC coefficient ACF for the new cluster is stored in memory. If the distortion does not exceed the limit, then the data block is assigned to the first cluster. In an iterative fashion this process is repeated. Each sampled data block is read from the memory and the process of calculating the distortion incurred by using each set of previously established cluster representatives is calculated. If the cluster establishment threshold is exceeded by each existing cluster representative, then a new cluster is established and coefficient data is again read into memory. If not, then the data block is assigned to the cluster which incurs the least representation distortion. Also, for each data block, the LPC gain value, the block index, and the cluster assignment are read to memory so that synthesis of the vector quantized signature can be accomplished. The process is continued until all data blocks have been examined. Finally, the LPC coefficients for each cluster are read in index fashion to memory also for use in synthesis. It is noted that the number of clusters established by this algorithm is largely a function of the chosen cluster establishment threshold. If the maximum number of clusters allowed is exceeded before all the data is examined, then the algorithm stops and a retry with a higher cluster establishment threshold is dictated. In practice, subsequent passes with successively lower establishment thresholds are conducted until the desired number of clusters is obtained.

This algorithm has proven extremely effective. For example, it required only four minutes to execute a single pass on 512 data blocks of eight millisecond duration, each containing 128 samples. It has been found that all 512 data blocks representing eight seconds of actual sound can be represented by less than two dozen coefficient sets for all of the long-term non-stationary signals examined.

A transition matrix is a matrix of elements $P_k(i, j)$, where $P_k(i,j)$ is the probability of a transition from cluster i at block k to cluster j at block k+1. The initial state occupancy vector (each state being associated with a cluster) is $P_o(i,j)$. These probability densities are estimated from the observed ensemble of multiple transient signature realizations, each of which is recorded and digitized. There exists a different transition matrix for each block transition and a different ordered set of transition matrices for each transient signature type.

Referring now to FIGS. 3A-3D, there is shown the transition probability matrices for the transitions between one cluster value to the same or a different cluster value when it is desired to synthesize the waveform for the next succeeding block from a present block. For example, referring now to FIGS. 2A-2D for the transition from the value of the cluster during block 1 to the cluster value in block 2, it is seen that for the waveforms 1–N that the cluster value is C1 for waveforms 1 and 2 with a transition to cluster C1 for waveform 1 and a transition from cluster C1 to cluster C2 for waveform 2. Waveforms 3 and N are seen to have cluster value C2 during block 1 with a cluster value C2 for block 2 of waveform 3 and a cluster value C3 for block 2 of waveform N. Applying these cluster values to the transition probability matrix illustrated in FIG. 3B for the transition from block 1 to block 2, it is seen that the transition from cluster C1 to the cluster C1 occurs half the time and the transition to cluster C2 occurs half the time. Similarly, the transition from cluster C2 to cluster C2 occurs half the time and the transition from cluster C2 to cluster C3 occurs half the time. For the limited number of waveforms being considered, there is no transition from clusters C3, C4 of block 1 to cluster C4 of block 2. Hence, these corresponding rows and columns have zero probability.

The cumulative probability matrix $P_k(i,j)$ consists of the accumulated probability densities, $$P_k(i,j) = \sum_{m=1}^{j} p(i,m)$$

where k represents the data block.

The cumulative probability matrixes shown in FIGS. 4A-4D are obtainable directly from each of the transition probability matrixes of FIGS. 3A-3D. Each column of a row of the transition probability matrix of FIG. 3 should serially accumulate probability densities as indicated in FIG. 4. FIG. 4 is utilized in the synthesis procedure of this invention. By utilizing a random number generator having values between 0 and including 1 to provide random numbers, the cluster transition from one block to the succeeding block given a particular cluster value in the one block is determined in accordance with the probability matrix. For example, referring to FIG. 4B, it is assumed that block 1 utilized cluster C2 in the synthesis procedure. Whether block 2 utilizes cluster C2 or C3 in the synthesis procedure is determined by the random number generator to be discussed subsequently. If the random number generator produces a number for the time period allocated to block 2 which is between 0 and 0.5 inclusive, then block 2 according to FIG. 4B will utilize the cluster group C2 as the coefficients which are applied to the LPC filter during the time period corresponding to block 2. However, if the random number generator had produced a number greater than 0.5 and equal to or less than 1, then the cluster set C3 would have been utilized during the time allocated to block 2 to generate the synthesized signal. It will be apparent to those skilled in the art that the probabilities associated with FIGS. 3A-3D and 4A-4D as well as the relative frequency of occurence of clusters are dependent upon the number of clusters which are possible in the transition from one block to the next successive block.

However, if instead it is assumed that block 1 of FIGS. 2A-2D had a cluster value C2 as for waveforms 3 and N and that block 2 has cluster values C1, C2, C3, C4 respectively for the four waveforms, then FIG. 3B would be modified so that the transition probability matrix would be as shown in FIG. 5A which shows equal probability of transition from cluster C2 of block 1 to each of the clusters C1-C4 of block 2. FIG. 5B shows the cumulative probability matrix corresponding to the transition probability matrix of FIG. 5A which when utilized in conjunction with the random number generator selects with equal probability which of the clusters C1-C4 will be utilized in the synthesis of the signal during block 2.

Figure 6:
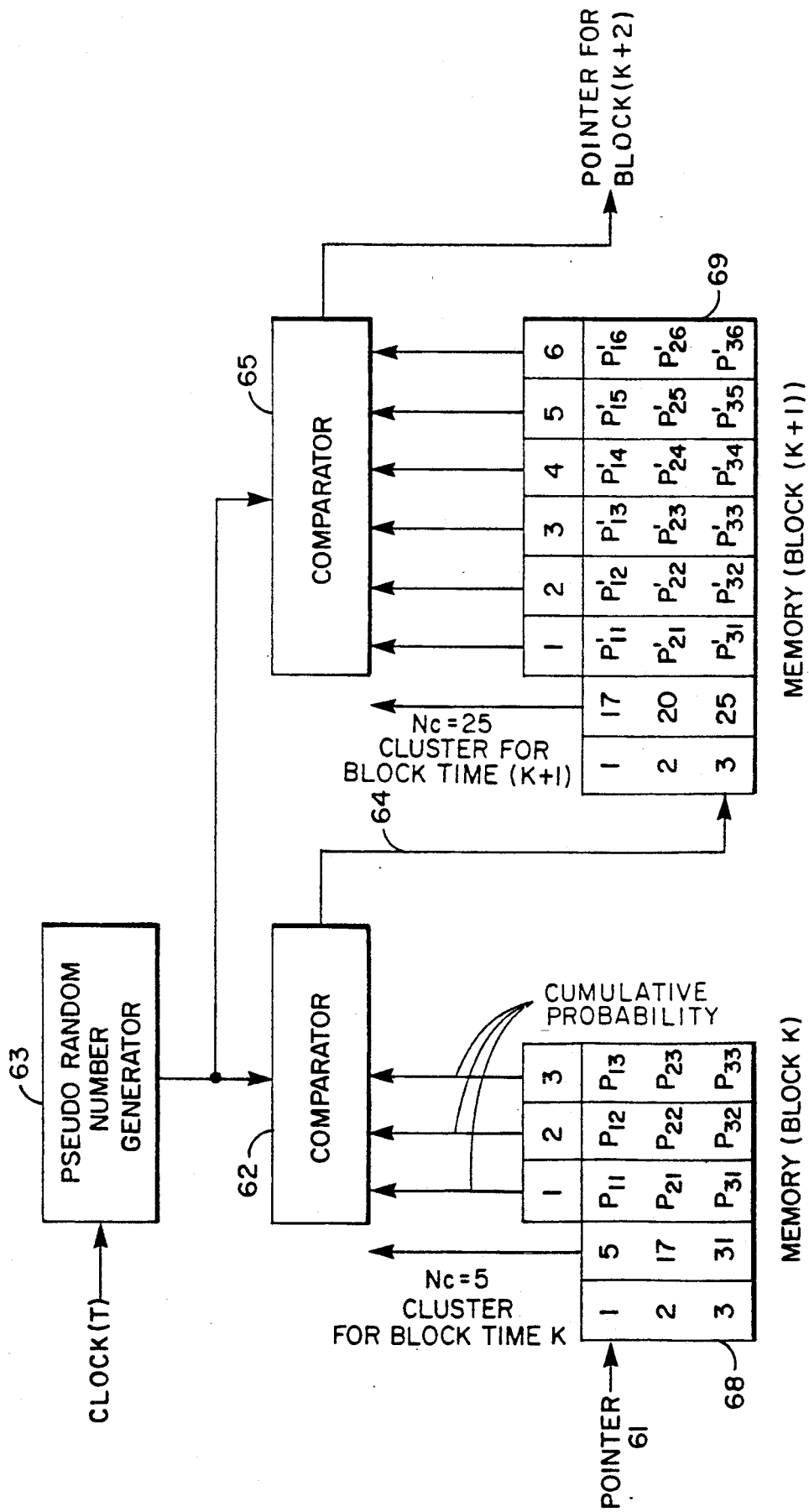
FIG. 6 shows in block diagram form apparatus for selecting clusters from cumulative probability values to successive blocks.

FIG. 6 represents the cumulative probability matrices for two successive blocks, block K and block K+1 in more general terms than that illustrated in FIGS. 4 and 5. FIG. 6 is also a representation of how the memory sectors 68, 69 which store and provide cluster data for each block K, (K+1), respectively, might be organized. It is assumed that a pointer 61 selects row 1 of a sector 68 of memory allocated to block K. The selection of row 1 provides cluster 5 for use in the LPC synthesis of block K. The LPC coefficients are contained in a memory 70 illustrated in FIG. 7 where the cluster number 5 designates row 5 in memory 70 which contains the LPC coefficients $a_0^5, \ldots a_n^5$. The LPC coefficient memory 70 of FIG. 7 can be structured in the form of a ROM memory. Pointer 61 applied to row 1 also provides the cumulative probabilities $P_{11}, \ldots, P_{13}$ which are provided to a comparator 62, which has another input from a pseudo random generator 63. If it is assumed that the random number provided by generator 63 falls between the cumulative probability values P12 and P13 inclusive, the comparator will provide an output corresponding to column 3, which is provided as a pointer 64 to row 3 of the memory segment corresponding to block (K+1). Pointer 64 will, at the time corresponding to, provide cluster 25 for block (K+1) and also provide all the cumulative probability values $P_{31}', \ldots, P_{36}'$ to the comparator 65 for selection of one cluster value for a time corresponding to block (K+2). It will be noted that a different number of columns corresponding to a different number of possible cluster values appear in the block K and block (K+1) memory sectors 68, 69 respectively. It is thus seen that the pseudo random number generator 63 in conjunction with the cumulative transition probabilities of block K is seen to provide the selection of the row (and cluster) for block (K+1), and so on for all the blocks in succession.

Figure 8:
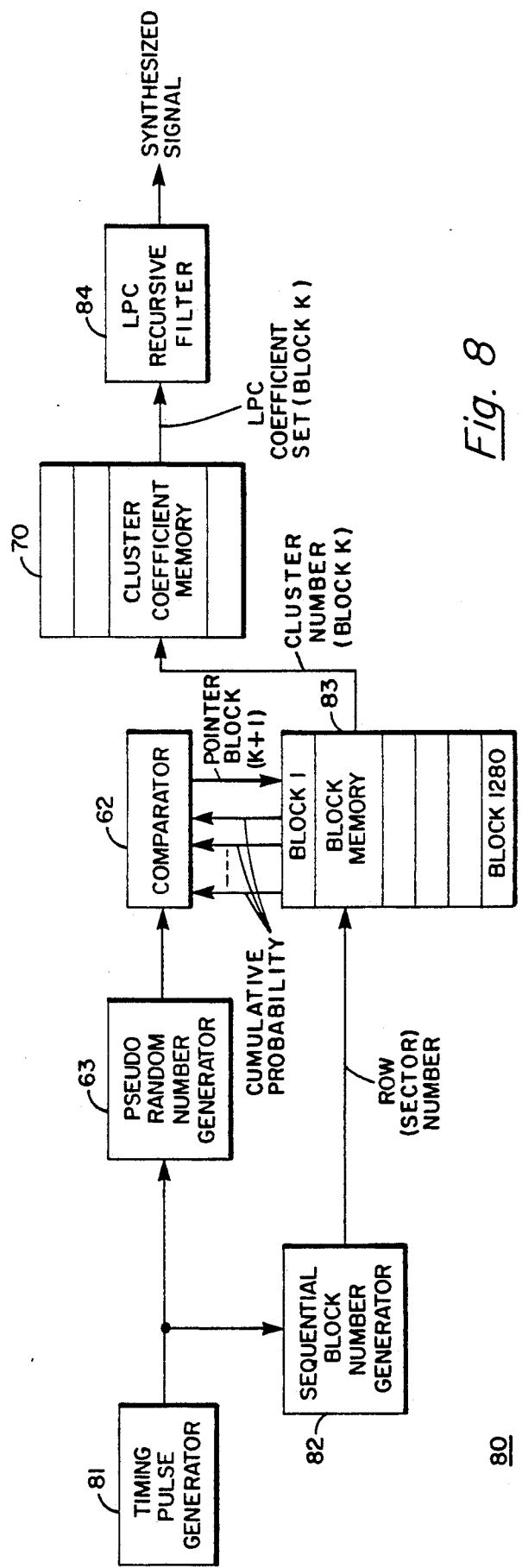
FIG. 8 is a block diagram of the synthesizer of this invention.

A block diagram of the Markov synthesizer 80 of this invention is shown in FIG. 8. A timing pulse generator 81 produces a pulse every T milliseconds corresponding to a block time, where T has been chosen in this application to be 8 milliseconds. The pulse is provided to the pseudo random number generator 63 and to a sequential block number generator 82. The block number generator 82 selects a block address in sequential fashion which determines which block memory sector (such as sectors 68, 69 of FIG. 6) is selected in block memory 83. As explained previously with respect to FIG. 6, a cluster number contained within the sector of memory 82 corresponding to block K is selected by block number generator 82 and the pointer for block K is read out of memory, 83 into the cluster coefficient memory 70 of FIG. 7. The cumulative probabilities provided by the same sector is provided to comparator 62, whose other input is provided by random number generator 63, to provide the cluster number and cumulative probabilities of block (K+1), and so on. The LPC coefficients for block K contained within memory 70 are selected by the cluster number from memory 83 block K and provided to the LPC recursive synthesizer filter 84, described in detail in the referenced patent application which provides at its output the desired transient synthesized signature.

Figure 9:
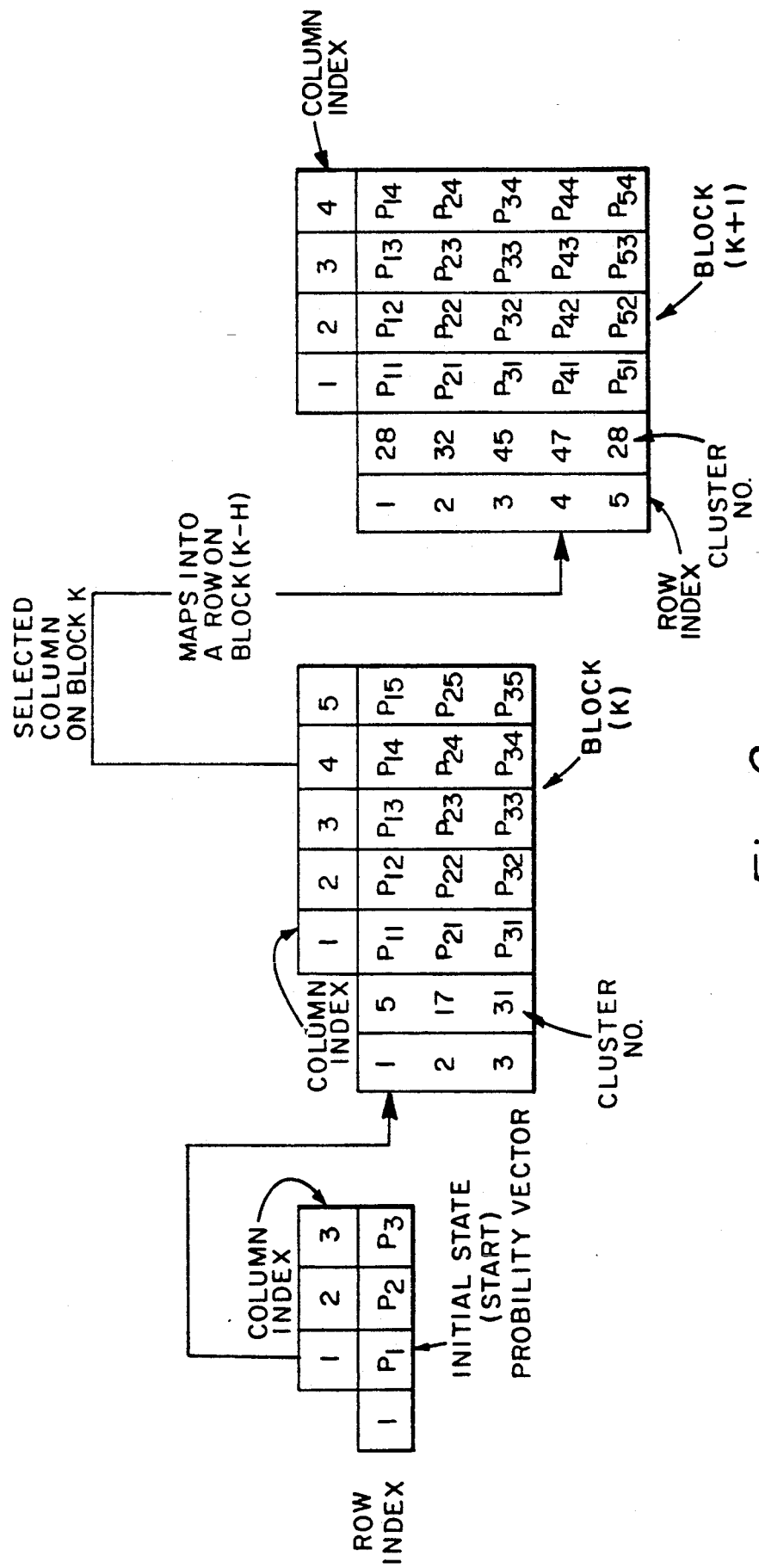
FIG. 9 shows transition matrices in a memory sector.

In summary, to synthesize a pseudo random signature using the direct Markov technique, a pseudo-random observation sequence must be generated from the Markov model discussed in the background section. This model is essentially a time varying Markov chain which consists of a set of states, an initial probability vector, and a set of transition matrices as shown in FIG. 9. Each matrix consists of rows and columns of transition probabilities, for example $P_{ij}$ in the $K^{th}$ matrix indicates the probability of entering row j on block K+1 given that the generator is in block i on block K. The entries are, therefore, discrete probability densities. Each row in addition contains an entry for the cluster set pointer. If the row is selected, then this entry points to the set of LPC coefficients to be used to synthesize the signal for block K.

Figure 10:
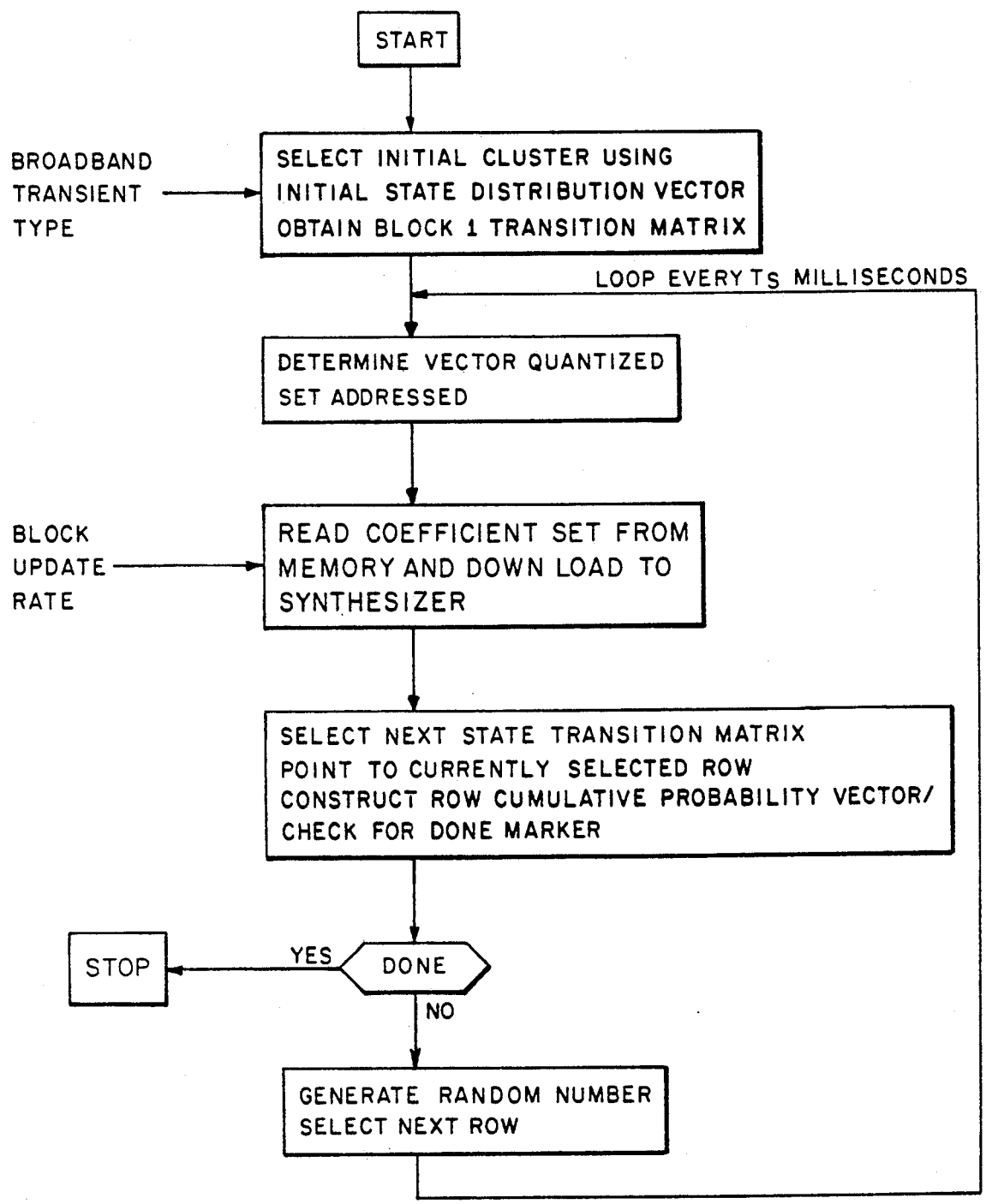
FIG. 10 is a flow diagram of the steps used in synthesizing a signal recording to this invention.

FIGS. 10 and 11 are flow diagrams of the synthesis and analysis process, respectively, of this invention which present in a different form the process steps described in the preceding specification.

Jointly quantized with each linear predictive coding coefficient cluster is the quantized gain factor "A" where A is discussed in the referenced U.S. patent application Ser. No. 332,414. Quantization of the gain factor A is determined by the minimum difference between the gain factor A and some prescribed set of allowable values of A. Thus, the quantized gain value together with the cluster coefficients comprise a set of representative cluster coefficients.

Having described a preferred embodiment of the invention, it will be apparent to one of skill in the art that other embodiments incorporating its concept may be used. It is believed, therefore, that this invention should not be restricted to the disclosed embodiment but rather should be limited only by the spirit and scope of the appended claims.

What is claimed is:

1. A method of providing a non-repetitive pseudo-random signal synthesis comprising the steps of:
    analyzing a plurality of signals from a source, each signal being divided into sequential blocks;
    sampling each block and analyzing each block of samples to determine the linear predictive coding coefficient sets of a recursive filter for each of said blocks of each of said signals;
    vector quantizing each set of said coefficients for each of said blocks of each of said signals to obtain a cluster representative coefficient set for each of said blocks, each cluster representative coefficient set representing an entire cluster of vector quantized linear predictive coding coefficient sets;
    determining the probability of a transition from one cluster representative coefficient set for one block to a next cluster representative coefficient set for the next successive block for all of the blocks of all of said signals;
    providing a cumulative probability value for each transition for corresponding blocks of each of said signals;
    storing said cumulative transition probability values and said cluster representative coefficient sets;
    successively generating a probability value for each successive block of the signal to be synthesized;
    providing a cluster representative of a block corresponding to a set of cumulative probability values for a next successive block;
    comparing said successively generated probability value for said next successive block with said cumulative probability values for said next successive block to determine a selected cluster representative for said next successive block;
    providing a selected cluster representative coefficient set corresponding to said selected cluster representative from a memory containing said cluster representative coefficient sets;
    applying said selected cluster representative coefficient set to a noise-excited recursive filter for a time corresponding to said block; and
    repeating the above process for successive blocks to provide said synthesized signal.

2. A method for providing pseudo-random clustered coefficient sets for linear predictive coding of a recursive filter comprising the steps of:
    analyzing a plurality of signals from a source, each signal being divided into sequential blocks;
    sampling each signal block and analyzing each block of samples to determine the linear predictive coding coefficient sets of a recursive filter for each of said blocks for each of said signals;
    vector quantizing each set of said coefficients for all of said blocks to obtain a cluster representative coefficient set for each of said blocks, each cluster representative coefficient set being associated with at least one block and being termed a cluster representative;
    determining the probability of a transition from one cluster representative for one block to a second cluster representative for the next successive block for all the blocks of all of said signals;
    providing a cumulative probability value for each transition for corresponding blocks of each of said signals; and
    storing said cumulative probability values and said cluster representative coefficient sets.

3. A method of providing a non-repetitive pseudo-random signal synthesis comprising the steps of:
    successively generating a probability value for each successive block of the signal to be synthesized;
    providing a cluster representative of a block corresponding to a set of cumulative probability values for a next successive block;
    comparing said successively generated probability value for said next successive block with said set of cumulative probability values stored for said next successive block to determine a selected cluster representative for said next successive block;

providing from a memory a set of cluster representative coefficients corresponding to said selected cluster representative;

providing said set of cluster representative coefficients to a recursive filter for a time corresponding to said block; and repeating the above process for successive blocks to provide said synthesized signal.

4. Apparatus for providing clustered linear predictive coding coefficients of a recursive filter comprising:

means for providing a plurality of signals;

means for obtaining sets of linear predictive coding coefficients of each time block of each of said signals;

means for vector quantizing said sets to reduce the number of sets to thereby provide representative clustered sets of coefficients;

means for determining the cumulative probabilities of a transition from each one of said representative clustered sets of coefficients of a block to each one of said representative clustered sets of coefficients of a next successive block; and memory means for storing said cumulative probabilities of transitions and said representative clustered sets of coefficients.

5. Apparatus for synthesizing a pseudo-random signal by applying linear predictive coding (LPC) coefficients to a recursive filter during prescribed time blocks comprising:

first memory means for storing sets of clustered LPC coefficients, each set of clustered LPC coefficients corresponding to a different address in said first memory means;

record memory means for storing the cumulative probabilities of a transition from each one of said sets of clustered coefficients of a block to each one of said sets of clustered coefficients of a next succeeding block as a function of a selected set of clustered coefficients;

means for selecting one of said cumulative probabilities for the set of clustered coefficients to be used in the next succeeding block;

means for repeating the selection of a set of clustered coefficients for each succeeding block; and means for providing said selected sets of clustered coefficients to said recursive filter in a succession of blocks to provide said synthesized signal.

6. A method for providing clustered linear predictive coding coefficients comprising the steps of:

establishing an initial and a final block index number for each of a plurality of signals, each signal being divided into blocks, a cluster establishment threshold, a number of linear predictive coding coefficients, and a number of clusters desired;

sampling the initial block of one of said signals;

computing linear predictive coding coefficients of said initial block to provide a cluster of coefficients from autocorrelation data of said initial block of said signal;

reading a successive block of said signal;

computing a representative distortion for each cluster;

establishing a least representative distortion from autocorrelation of said successive blocks;

determining whether said least representative distortion is less than a predetermined threshold value;

entering a minimum distortion cluster and gain into a block record database and updating cluster statistics, in response to said least representative distortion being less than said predetermined threshold value;

establishing new cluster and load coefficient autocorrelation data, in response to said least representative distortion being more than said predetermined threshold value;

determining if the desired number of clusters is exceeded;

determining whether all data blocks have been analyzed, in response to said desired number of clusters not having been exceeded;

loading cluster representative data into a database and outputting cluster statistics, in response to said desired number of clusters having been exceeded; and returning to the step of reading a successive block and repeating all subsequent steps until the successive block corresponds to said final block index number.

7. A method for synthesizing a signal from clustered linear predictive coded coefficients of blocks of recursive filters comprising the steps of:

selecting an initial cluster using an initial state distribution vector from the transition matrix of a first block;

determining a vector quantized coefficient set addressed by comparing with a random number;

reading a coefficient set from memory;

providing said coefficient set to said recursive filter for a time corresponding to a block update rate;

selecting a next state transition matrix to a currently selected row and constructing a row cumulative probability vector;

generating a random number; and repeating the above steps beginning with determining a vector quantized coefficient set by comparing said row cumulative probability vector with said random number.

8. A method for providing probability-weighted clustered linear predictive coding coefficients of a recursive filter comprising the steps of:

providing a plurality of samples of each time block of a plurality of signals;

determining the linear predictive coding coefficient sets of a recursive filter from said plurality of said samples of each said time block;

replacing each of said sets with a set previously determined without exceeding an allowable distortion limit to provide a reduced number of sets referred to as clustered sets;

determining for each corresponding block of each of said plurality of signals the probability of a transition from one clustered set in one block to one of said clustered sets in the next successive block;

providing the cumulative probability for each block of a transition from each one of said clustered sets to each one of said clustered sets; and storing in a different memory sector said cumulative probability for each block.

* * * * *